United States Patent
Sun

(10) Patent No.: US 8,443,213 B2
(45) Date of Patent: May 14, 2013

(54) MOTHERBOARD CAPABLE OF DETECTING CONSUMED POWER AND DETECTION METHOD THEREOF

(75) Inventor: Pei-Hua Sun, Taipei (TW)

(73) Assignee: Asustek Computer Inc., Taipei (TW)

( * ) Notice: Subject to any disclaimer, the term of this patent is extended or adjusted under 35 U.S.C. 154(b) by 557 days.

(21) Appl. No.: 12/712,316

(22) Filed: Feb. 25, 2010

(65) Prior Publication Data

US 2010/0241876 A1 Sep. 23, 2010

(30) Foreign Application Priority Data

Mar. 20, 2009 (TW) .............................. 98109297 A

(51) Int. Cl.
*G06F 1/26* (2006.01)

(52) U.S. Cl.
USPC .......................................... 713/300; 713/340

(58) Field of Classification Search ........................ None
See application file for complete search history.

(56) References Cited

U.S. PATENT DOCUMENTS

| | | | | |
|---|---|---|---|---|
| 5,777,276 | A * | 7/1998 | Zhu ................................ | 174/263 |
| 7,103,786 | B2 | 9/2006 | Chen et al. | |
| 2002/0046868 | A1 * | 4/2002 | Borg et al. ................ | 174/113 R |
| 2008/0018325 | A1 * | 1/2008 | Yu et al. ......................... | 324/142 |
| 2008/0071485 | A1 | 3/2008 | Chen et al. | |
| 2010/0037079 | A1 * | 2/2010 | Nieh et al. ..................... | 713/340 |

FOREIGN PATENT DOCUMENTS

| | | |
|---|---|---|
| EP | 0969286 A2 | 1/2000 |
| TW | 515896 | 1/2003 |
| TW | 200700970 | 1/2007 |
| TW | M340455 | 9/2008 |

OTHER PUBLICATIONS

English language translation of abstract of M340455 (published Sep. 11, 2008).
English translation of abstract of TW 200700970.
English translation of abstract of TW 515895.

* cited by examiner

*Primary Examiner* — Dennis M Butler
(74) *Attorney, Agent, or Firm* — McClure, Qualey & Rodack, LLP

(57) ABSTRACT

A motherboard capable of detecting consumed power and a method for detecting consumed power thereof are provided. The motherboard includes a VCC layer, a plurality of resistance elements, and a detecting module. A plurality of power traces are laid at the VCC layer, and each of the power traces conducts an operating voltage, respectively. The resistance elements are laid at sources of each of the power traces, respectively. The detecting module is coupled with each of the resistance elements, respectively, to obtain a current value of a current flowing through each of the resistance elements, and generates consumed power corresponding to each of the operating voltages according to the current value and the operating voltage corresponding to the current value.

10 Claims, 3 Drawing Sheets

MOTHERBOARD CAPABLE OF DETECTING CONSUMED POWER AND DETECTION METHOD THEREOF

CROSS-REFERENCES TO RELATED APPLICATIONS

This non-provisional application claims priority under 35 U.S.C. §119(a) on Patent Application No. 98109297 filed in Taiwan, R.O.C. on Mar. 20, 2009, the entire contents of which are hereby incorporated by reference.

BACKGROUND OF THE INVENTION

1. Field of the Invention

The invention relates to a motherboard and, more particularly, to a motherboard capable of detecting consumed power and a method for detecting consumed power thereof.

2. Description of the Related Art

Due to the increasing environmental consciousness, power saving and carbon reduction becomes a trend, and technical products are developed to be electricity-saving. In respect of a computer system, a motherboard also should be environment-friendly, and power efficiency thereof is gradually improved to make the motherboard more and more electricity-saving as a whole. However, even the motherboard manufacturer gradually reduces power consumption of the motherboard; the consumed power of the motherboard in use also cannot be easily known.

Conventionally, to know about the consumed power of the motherboard, the user needs to gather all electric wires with an operating voltage (such as 12 volts (V)) of the power supply via a current clamp meter clamping the electric wires with the same operating voltage, and then the current value (such as 10 amperes (A)) is read from the current clamp meter. Afterwards, the consumed power corresponding to the 12 V operating voltage is calculated with a formula P=V×I to be 120 watts (W) (12(V)×10(A)=120(W)). Similarly, currents corresponding to other operating voltages such as 5 V, 3.3 V, and standby power of the power supply in the computer system are measured using the above method, respectively. Then, the currents are multiplied by the operating voltage corresponding to the currents, respectively, to obtain individual consumed power. Finally, the individual consumed power is added up to obtain the motherboard total consumed power.

According to the conventional method as stated above, the user not only needs the current clamp meter, he or she also needs to identify the electric wires with the same operating voltages, which is difficult for the user. Furthermore, when a casing of the computer system is assembled, the measurement as stated above cannot proceed smoothly. Consequently, it is difficult for the user to know about the consumed power of the motherboard.

BRIEF SUMMARY OF THE INVENTION

The invention provides a motherboard capable of detecting consumed power including a VCC layer, a resistance element, and a detecting module. A plurality of power traces are laid on the VCC layer, and each of the power traces conducts an operating voltage, respectively. The resistance elements are laid at sources of each of the power traces, respectively. The detecting module is coupled with each of the resistance elements, respectively, to obtain a current value of a current flowing through each of the resistance elements and generates consumed power corresponding to each of the operating voltages according to the current value and the operating voltage corresponding to the current value.

The invention also provides a method for detecting motherboard consumed power. The method is adapted for a motherboard with a VCC layer. A plurality of power traces and a plurality of resistance elements are laid at the VCC layer, and each of the power traces conducts an operating voltage, respectively. The method includes the following steps. First, a current value of a current flowing through each of the resistance elements is obtained, respectively. Second, consumed power corresponding to each of the operating voltages is generated according to the current value and the operating voltage corresponding to the current value.

According to the motherboard capable of detecting the consumed power and the method for detecting the consumed power thereof according to the invention, the user may easily obtain the individual consumed power of each of the operating voltages in the computer system or the motherboard total consumed power. Consequently, the information people expect to monitor at anytime, which is the motherboard consumed power, may be easily presented to the users. For example, the user may directly obtain the present consumed power of the motherboard via an application under an operation system (OS).

These and other features, aspects and advantages of the present invention will become better understood with regard to the following description, appended claims, and accompanying drawings.

DETAILED DESCRIPTION OF THE EMBODIMENTS

Figure 1:
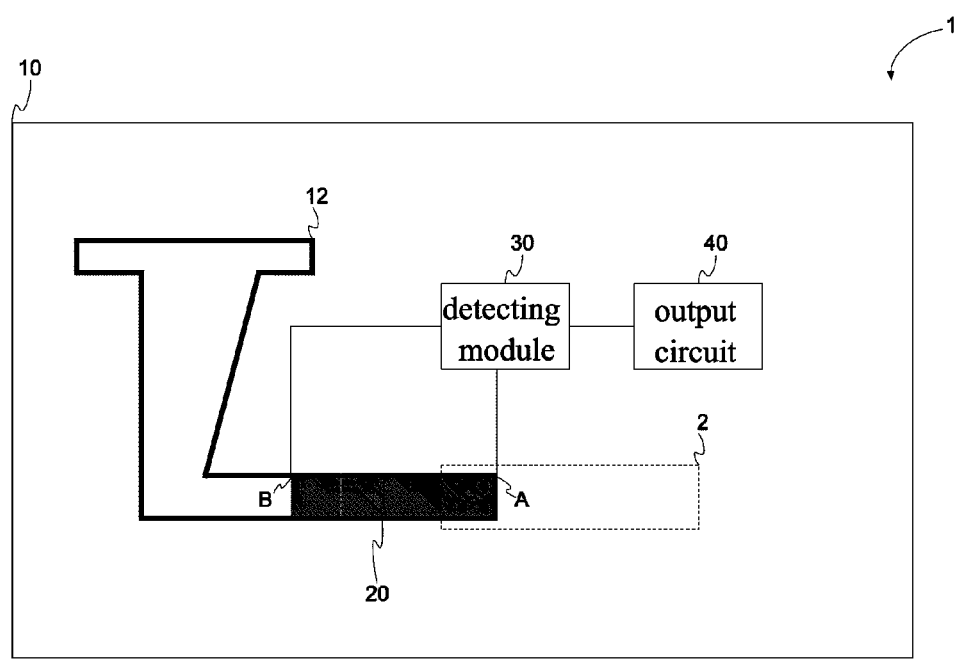
FIG. 1 is a schematic diagram showing a motherboard capable of detecting consumed power according to an embodiment of the invention.

FIG. 1 is a schematic diagram showing a motherboard capable of detecting consumed power according to an embodiment of the invention. A motherboard 1 capable of detecting consumed power includes a VCC layer 10, a resistance element 20, and a detecting module 30.

The motherboard 1 of a computer device is usually a four-layer board. The four layers are a top side, a VCC layer, a GND layer, and a bottom side, respectively. A plurality of power traces 12 are laid on the VCC layer 10, and each of the power traces 12 are used for conducting operating voltages with different voltage values, respectively, which are provided to the computer device. In FIG. 1, only the VCC layer 10 of the motherboard 1 and one of the power traces are drawn to illustrate the invention.

The motherboard 1 has a power connector 2 (disposed on the top side) to be connected with the power supply (in this embodiment, the used connector is an ATX connector). The power connector 2 has a plurality of pins, and some of the pins are used as the source of an operating voltage to lay the power trace. The power traces transmit the operating voltage (5V, 12V) to components of the computer device, respectively, to keep the components operating normally. In FIG. 1, the 5V operating voltage is taken as an example to illustrate the invention. Usually, four pins of the power connector 2 correspond to the 5V operating voltage. Consequently, the four pins of the power connector 2 are used as the source to lay the power trace 12 for conducting the 5 V operating voltage. The power trace 12 (on the VCC layer in this embodiment) and the power connector 2 (on the top side) may be disposed on different layers, respectively. However, the power trace 12 is connected with the power connector 2. Consequently, the power connector 2 in FIG. 1 is drawn with a dotted line.

The resistance element 20 is laid at the source of the power trace 12. The resistance element may be copper foil, a Mn—Cu wire, a Ni—Mn wire, or a resistor. The detecting module 30 is coupled with the resistance element 20 to obtain the current value of a current flowing through the resistance element 20. Then, the consumed power corresponding to the 5 V operating voltage is generated according to the current value and the operating voltage (5 V herein) corresponding to the current value.

For example, the copper foil with a fixed width is laid at the source of the power trace 12 to be used as the resistance element 20. A resistance (R) is calculated with a formula $R=\rho(L/A)$ according to its physical definition, wherein $\rho$ is a dielectric constant, L is length, and A is cross-sectional area. The cross-sectional area (A) may be obtained by multiplying the thickness by the width of the copper foil. The length (L) may be directly measured via layout software. As a result, the resistance of the resistance element 20 may be calculated via the above formula.

After the detecting module 30 obtains the resistance of the resistance element 20, as long as a voltage drop between two terminals A and B of the resistance element 20 is obtained, the current value (I) of the resistance element 20 may be calculated according to the Ohm's law (I=V/R) with the resistance (R) and the voltage drop (V).

Figure 2:
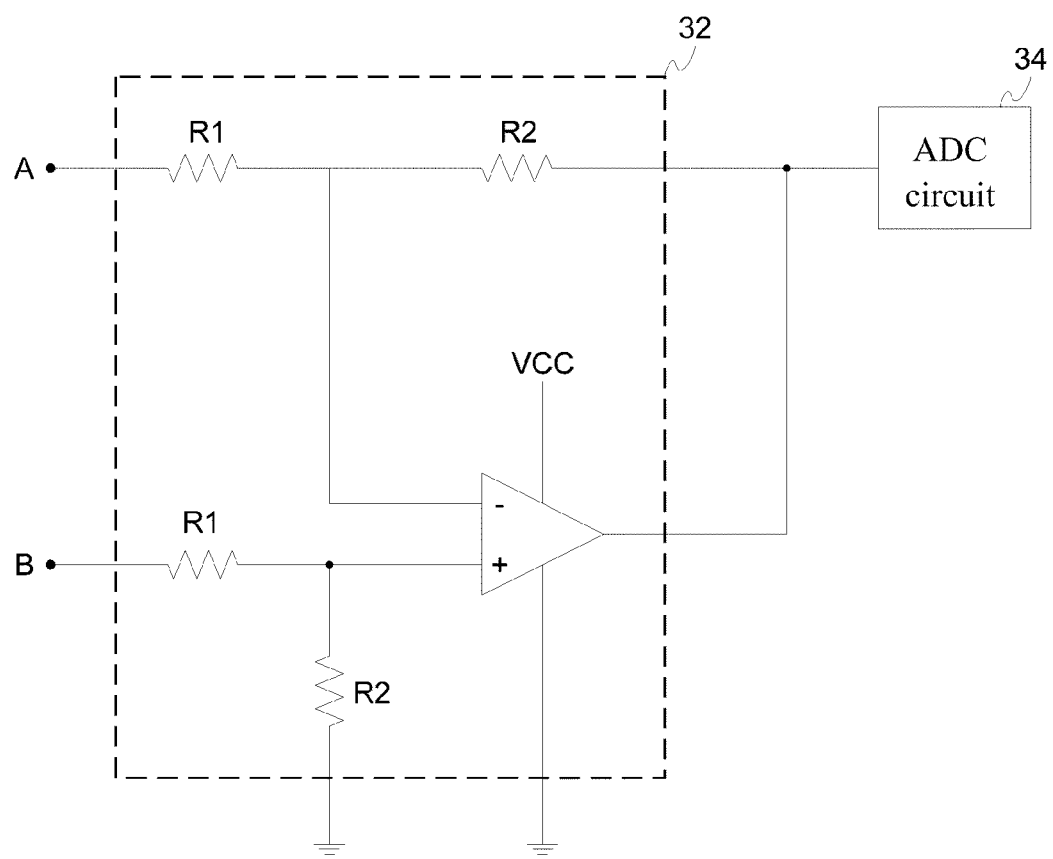
FIG. 2 is a schematic diagram showing a detecting module according to an embodiment of the invention.

However, the voltage drop between the two terminals A and B of the resistance element 20 is usually very small. To make the voltage drop easily detected to facilitate calculating the consumed power subsequently, as shown in FIG. 2, the detecting module 30 includes an amplification circuit 32 and an analog-to-digital converter (ADC) circuit 34.

The two terminals A and B of the resistance element 20 are connected with a negative terminal (−) and a positive terminal (+) of an operational amplifier (OP) of the amplification circuit 32, respectively, via a voltage division circuit. The voltage difference between the two terminals A and B of the resistance element 20 is amplified to an acceptable analog voltage level for the backend ADC circuit 34 via the amplification circuit 32. As shown in FIG. 2, the value of a voltage (Vout) amplified by the amplification circuit 32 is represented by a mathematical expression:

$$Vout = \frac{R2}{R1}(VB - VA),$$

wherein VB is the voltage at the B terminal of the resistance element 20, and VA is the voltage at the A terminal of the resistance element 20. Assuming that R1 is 1 KΩ, and R2 is 70 KΩ, the voltage drop across the resistance element 20 is amplified seventy times via the amplification circuit 32. As a result, the voltage (Vout) is easily detected. An amplification ratio may be set according to demands, which is not limited thereto. Furthermore, a correspondence table may be created first; the amplified voltage values are easily back-calculated to the actual voltage values of the resistance element 20 with the correspondence table.

The ADC circuit 34 of the detecting module 30 may be an input/output (I/O) chip or an embedded controller, which is a built-in component in the computer device and used for detecting the voltage. As a result, the ADC circuit 34 may be coupled with the amplification circuit 32 to detect the amplified analog voltage drop and convert the analog voltage values to digital voltage values to facilitate the subsequent calculation.

For example, it is supposed that the copper foil with a length of 5 centimeters (cm), a width of 2 cms, and a thickness of 1.2 mils, which is about 0.003048 cms, is laid at the source of the 5 V power trace 12 to be used as the resistance element 20. The dielectric constant ($\rho$) of copper is about 1.67 $\mu\Omega$-cm, and the direct current (DC) resistance (R) of the copper foil is about 1.37 m$\Omega$ (R=$\rho \times$L/A=1.67$\times$10−6$\times$5/(2$\times$0.003048) =0.00137). If the voltage difference between the two terminals A and B of the resistance element 20 is 0.01V, which is quite small, the voltage needs to be amplified via the amplification circuit 32 to be easily detected. At that moment, the calculated resistance and the calculated voltage drop may be used to obtain the current value (I) of the current flowing through the resistance element 20, which is I=V/R=0.01V/ 1.37 m$\Omega$=7.3 A. Finally, the consumed power (P) of the 5 V operating voltage is calculated to be 36.5 watts according to the current value (I) and the operating voltage (5V) corresponding to the current value (I) (P=V$\times$I=5V$\times$7.3 A=36.5 W).

Similarly, the consumed power corresponding to each of the operating voltages may be obtained according to the above method via the detecting module 30. Additionally, the consumed power corresponding to each of the operating voltages may be added up via the calculation of a software program to generate motherboard total consumed power. In FIG. 1, the output circuit 40 is used for outputting the detected consumed power and/or the detected motherboard total consumed power via the detecting module 30 to the user. Consequently, the user can easily obtain the relating consumed power of the motherboard 1 clearly via a computer display.

Figure 3:
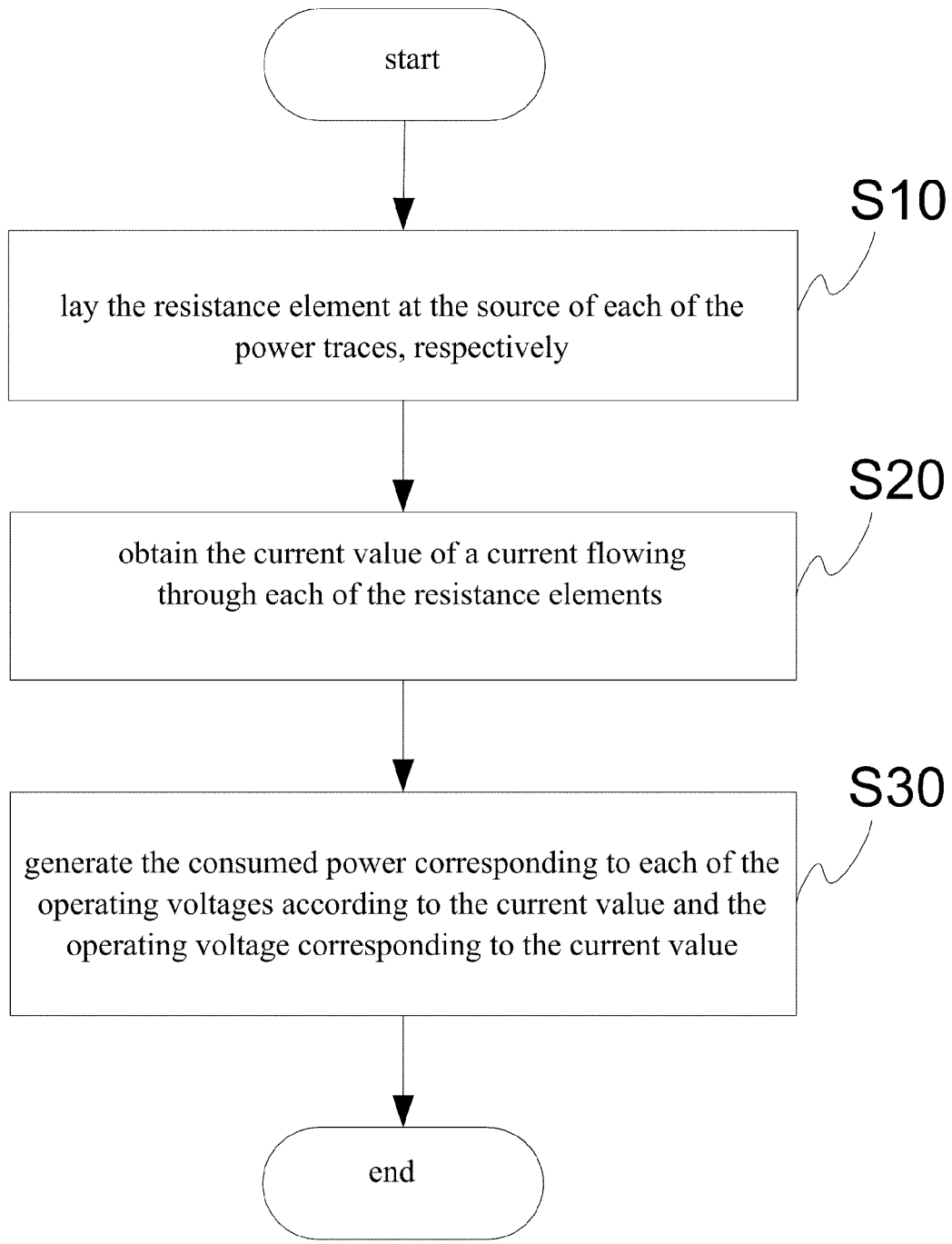
FIG. 3 is a flow chart showing a method for detecting motherboard consumed power according to an embodiment of the invention.

FIG. 3 is a flow chart showing a method for detecting consumed power of a motherboard according to an embodiment of the invention. The method is applied to a motherboard having a VCC layer. A plurality of power traces are laid at the VCC layer. Each of the power traces conducts the operating voltage, respectively. The detecting method includes the following steps.

At step S10, the resistance element is laid at the source of each of the power traces, respectively.

At step S20, the current value of a current flowing through each of the resistance elements is obtained, respectively. The step S20 may include the following steps. First, the resistance of each of the resistance elements and a voltage drop between terminals of the resistance element are obtained, respectively. The current value of each of the resistance elements is generated according to the resistance and the voltage drop.

Furthermore, to avoid that the voltage drop between the two terminals of the resistance element is too small to be measured, the voltage drop may be amplified, and the amplified voltage drop may be converted to a digital signal.

At step S30, the consumed power corresponding to each of the operating voltages is obtained according to the current value and the operating voltage corresponding to the current value.

After the consumed power corresponding to each of the operating voltages is obtained, the consumed power corresponding to each of the operating voltages may be added up. As a result, the motherboard total consumed power may be generated. Then, the consumed power corresponding to each of the operating voltages and/or the motherboard total consumed power may be outputted.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A motherboard capable of detecting consumed power, comprising:
    a VCC layer, wherein a plurality of power traces are laid on the VCC layer, and each of the power traces conducts an operating voltage, respectively;
    a plurality of resistance elements laid at sources of the power traces, respectively; and
    a detecting module coupled with each of the resistance elements, respectively, to obtain a current value of a current flowing through each of the resistance elements and generate consumed power corresponding to each of the operating voltages according to the current value and the operating voltage corresponding to the current value, wherein the detecting module obtains resistance of each of the resistance elements and a voltage drop between two terminals of the resistance element, the detecting module comprises:
        an amplification circuit receiving the voltage drop and amplifying the voltage drop; and
        an analog-to-digital converter (ADC) circuit converting the amplified voltage drop to a digital signal.

2. The motherboard capable of detecting the consumed power according to claim 1, wherein each resistance element is one of, or a combination of copper foil, a Mn—Cu wire, a Ni—Mn wire, and a resistor.

3. The motherboard capable of detecting the consumed power according to claim 1, wherein the detecting module adds up the consumed power corresponding to each of the operating voltages to generate motherboard total consumed power.

4. The motherboard capable of detecting the consumed power according to claim 3, further comprising: an output circuit outputting at least one of the consumed power and the motherboard total consumed power.

5. The motherboard capable of detecting the consumed power according to claim 1, wherein the detecting module generates the current value of each of the resistance elements according to the resistance and the voltage drop.

6. The motherboard capable of detecting the consumed power according to claim 1, wherein the ADC circuit is an input/output (I/O) chip.

7. The motherboard capable of detecting the consumed power according to claim 1, wherein the ADC circuit is an embedded controller.

8. A method for detecting motherboard consumed power, adapted for a motherboard with a VCC layer, a plurality of power traces and a plurality of resistance elements laid at the VCC layer, and each of the power traces conducting an operating voltage, respectively, the method comprising:
    obtaining resistance of each of the resistance elements and a voltage drop between two terminals of the resistance element;
    amplifying the voltage drop;
    converting the amplified voltage drop to a digital signal;
    obtaining a current value of a current flowing through each of the resistance elements, respectively; and
    generating consumed power corresponding to each of the operating voltages according to the current value and the operating voltage corresponding to the current value.

9. The method for detecting the motherboard consumed power according to claim 8, further comprising: adding up the consumed power corresponding to each of the operating voltages to generate motherboard total consumed power; and outputting at least one of the consumed power and the motherboard total consumed power.

10. The method for detecting motherboard consumed power according to claim 8, wherein the step of obtaining the current value comprises: generating the current value of each of the resistance elements according to the resistance and the voltage drop.

* * * * *